(12) United States Patent
Pai et al.

(10) Patent No.: US 7,968,802 B2
(45) Date of Patent: Jun. 28, 2011

(54) PRINTED CIRCUIT BOARD WITH DIFFERENTIAL TRACES

(75) Inventors: Yu-Chang Pai, Tu-Cheng (TW); Shou-Kuo Hsu, Tu-Cheng (TW); Chien-Hung Liu, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 850 days.

(21) Appl. No.: 11/967,017

(22) Filed: Dec. 29, 2007

(65) Prior Publication Data

US 2009/0107716 A1    Apr. 30, 2009

(30) Foreign Application Priority Data

Oct. 25, 2007 (CN) .......................... 2007 1 0202253

(51) Int. Cl.
*H05K 1/11* (2006.01)
*H01P 1/00* (2006.01)
(52) U.S. Cl. ...................... 174/262; 333/260
(58) Field of Classification Search .............. 174/252, 174/262, 266; 361/760, 777; 257/698; 333/5
See application file for complete search history.

(56) References Cited

U.S. PATENT DOCUMENTS

| 2002/0008599 A1 | 1/2002 | Sridharan et al. |
| 2002/0179332 A1* | 12/2002 | Uematsu et al. ............ 174/262 |
| 2006/0076160 A1* | 4/2006 | Hsu et al. ................... 174/262 |

* cited by examiner

*Primary Examiner* — Davienne Monbleau
*Assistant Examiner* — Roshn K Varghese
(74) *Attorney, Agent, or Firm* — Frank R. Niranjan

(57) ABSTRACT

A printed circuit board (PCB) includes a differential pair having a first differential trace and a second differential trace, a first via having an upper cap and a lower cap, and a second via having an upper cap and a lower cap. The first differential trace includes a first segment and a second segment, the second differential trace includes a third segment and a fourth segment. The first and the third segments are electrically coupled to the upper caps of the first and the second vias respectively. The second and the fourth segments are electrically coupled to the lower caps of the first and the second vias respectively. The first and the third segments extend from corresponding upper caps in different directions, the second and the fourth segments extend from corresponding lower caps in different directions.

3 Claims, 2 Drawing Sheets

PRINTED CIRCUIT BOARD WITH DIFFERENTIAL TRACES

BACKGROUND

1. Field of the Invention

The present invention relates to printed circuit boards (PCBs), and particularly to a PCB which can reduce common-mode noise and electro-magnetic radiation between two differential traces of a differential pair.

2. Description of Related Art

Referring to FIG. 2, a partial cross-sectional view of a conventional PCB is illustrated. As shown, the PCB 1 includes a differential pair 100 having two differential traces 101 and 102 disposed within a signal layer in an edge-coupled mode, and two reference layers 110 and 120 arranged at two sides of the signal layer. The differential impedance between the two differential traces 101 and 102 can be adjusted by changing the distance between the signal layer and the reference layers 110 and 120. A preferred value of the differential impedance is approximately 100 ohms.

However, some PCBs are very thin (such as a Flexible Printed Circuit Board (FPCB)) and the distance between the signal layer and the reference layers is difficult to adjust. A conventional means is cutting the reference layers into grids, but that can cause too much common-mode noise and electro-magnetic radiation.

What is desired, therefore, is to provide a PCB which overcomes the above problems.

SUMMARY

An embodiment of a printed circuit board (PCB) includes a differential pair having a first differential trace and a second differential trace, a first via having an upper cap and a lower cap respectively disposed on a top layer and a bottom layer of the PCB, and a second via having an upper cap and a lower cap respectively disposed on the top layer and the bottom layer of the PCB. The first differential trace comprising a first segment and a second segment, the second differential trace comprising a third segment and a fourth segment. The first and the third segments are disposed on the top layer of the PCB, and are electrically coupled to the upper caps of the first and the second vias respectively. The second and the fourth segments are disposed on the bottom layer of the PCB, and are electrically coupled to the lower caps of the first and the second vias respectively. The first and the third segments extend from corresponding upper caps in different directions, the second and the fourth segments extend from corresponding lower caps in different directions.

Other advantages and novel features of the present invention will become more apparent from the following detailed description of an embodiment when taken in conjunction with the accompanying drawings, in which:

DETAILED DESCRIPTION

Figure 1:
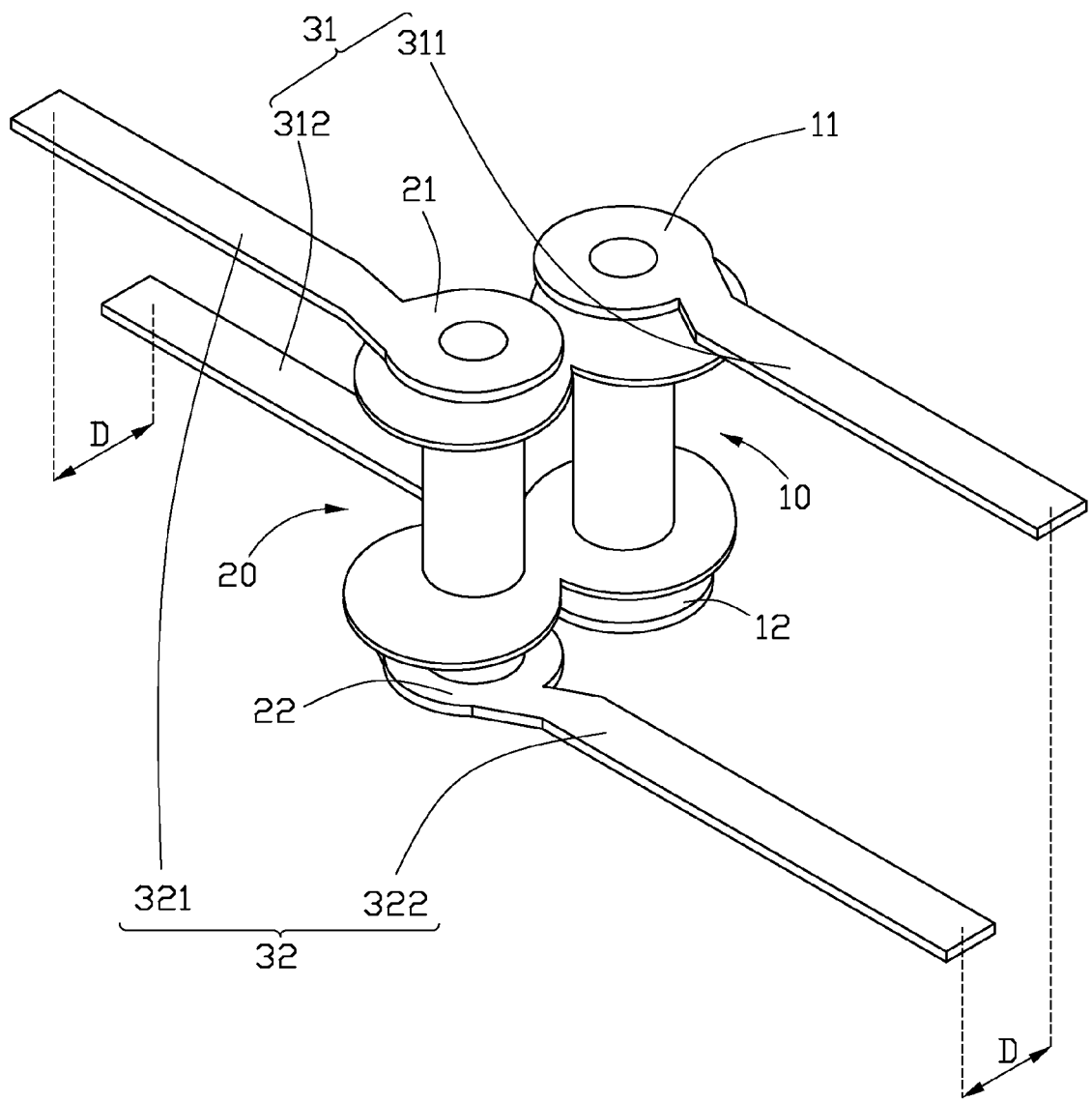
FIG. 1 is a schematic view of a PCB in accordance with an embodiment of the present invention.
Figure 2:
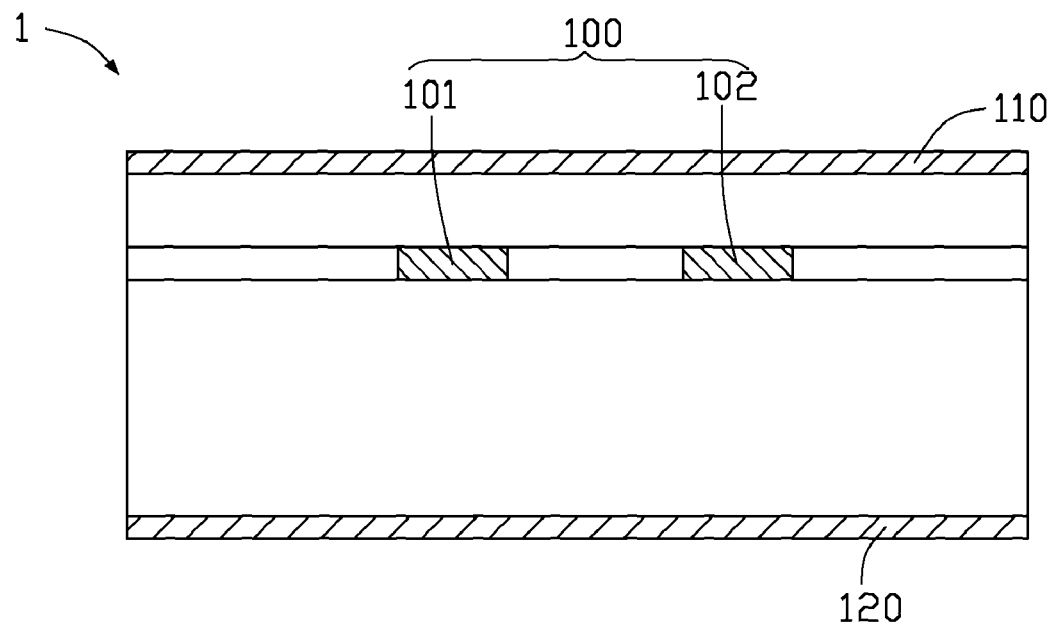
FIG. 2 is a partial cross-sectional view of a conventional PCB.

Referring to FIG. 1, a printed circuit board (PCB) in accordance with an embodiment of the present invention includes two vias 10, 20, and a differential pair having two differential traces 31, 32. The via 10 includes an upper cap 11 and a lower cap 12, the via 20 includes an upper cap 21 and a lower cap 22. The differential trace 31 includes two segments 311, 312, the differential trace 32 includes two segments 321, 322. The segments 311, 321 are electrically coupled to the upper caps 11, 21 respectively. The segments 312, 322 are electrically coupled to the lower caps 12, 22 respectively. The segments 311, 321 extend from corresponding caps 11, 21 in opposite directions. The segments 312, 322 extend from corresponding caps 12, 22 in opposite directions.

In practice, it is only required that the segments 311, 321 extend from the corresponding caps 11, 21 in different directions, and the segments 312, 322 extend from the corresponding caps 12, 22 in different directions to achieve reduced common-noise and electro-magnetic radiation, however, the best results will be achieved if the segments 311, 321 extend from corresponding caps 11, 21 in opposite directions, and if the segments 312, 322 extend from corresponding caps 12, 22 in opposite directions.

The vias 10, 20 are disposed in and run through the PCB. The upper caps 11, 21 are disposed on a top layer of the PCB. The lower caps 12, 22 are disposed on a bottom layer of the PCB. The segment 311 disposed on the top layer of the PCB is electrically coupled to the segment 312 disposed on the bottom layer of the PCB through the via 10. The segment 321 disposed on the top layer of the PCB is electrically coupled to the segment 322 disposed on the bottom layer of the PCB through the via 20. A distance between the segment 322 and the segment 311 in the horizontal direction is D. A distance between the segment 312 and the segment 321 in the horizontal direction is D. That is, offset between the differential traces 31, 32 is D. Differential impedance between the differential traces 31, 32 can be calculated with this formula:

$$Z_{Diff} \approx 2\sqrt{\frac{L_{11}-L_{12}}{C_{11}+C_{12}}}$$

Wherein, $Z_{Diff}$ is the differential impedance between the differential traces 31, 32. $C_{11}$ and $L_{11}$ are respectively capacitance and inductance of the differential pair 10 to ground. $C_{12}$ and $L_{12}$ are respectively coupling capacitance and coupling inductance between the differential traces 31, 32.

The offset D can be adjusted according to need. When the offset D is increased, the area falling between where the differential traces 31, 32 overlap, will be reduced, thereby the capacitance $C_{12}$ will be reduced, and the differential impedance $Z_{Diff}$ will be increased. Thus, the differential impedance $Z_{Diff}$ can be adjusted by changing the offset D.

Because the differential impedance $Z_{Diff}$ can be adjusted by changing the offset D, common-mode noise between the differential traces 31, 32 of the differential pair in present invention is minimized. When the segments communicate with each other, signals transmitted from the segment 311 to the segment 312 go through the via 10, and signals transmitted from the segment 321 to the segment 322 go through the via 20. Directions of currents in the segments 311, 321 are opposite, and directions of currents in the segments 312, 322 are opposite. Therefore electro-magnetic radiation between the differential traces 31, 32 of the differential pair can also be minimized.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board (PCB) comprising:
   a first via having an upper cap disposed on a top layer of the PCB, and a lower cap disposed on a bottom layer of the PCB;
   a second via having an upper cap disposed on the top layer of the PCB, and a lower cap disposed on the bottom layer of the PCB; and
   a differential pair having a first differential trace comprising a first segment and a second segment, and a second differential trace comprising a third segment and a fourth segment, wherein the first and the third segments are disposed on the top layer of the PCB, and are electrically coupled to the upper caps of the first and the second vias respectively, the second and the fourth segments are disposed on the bottom layer of the PCB, and are electrically coupled to the lower caps of the first and the second vias respectively, the first and the third segments extend from corresponding upper caps in different directions, the second and the fourth segments extend from corresponding lower caps in different directions.

2. The PCB as claimed in claim 1, wherein the first and the third segments extend from corresponding upper caps in opposite directions.

3. The PCB as claimed in claim 2, wherein the second and the fourth segments extend from corresponding lower caps in opposite directions.

* * * * *